(12) United States Patent
Chou

(10) Patent No.: US 6,591,384 B1
(45) Date of Patent: Jul. 8, 2003

(54) COMPARABLE CIRCUITS FOR PARALLEL TESTING DRAM DEVICE

(75) Inventor: Yung-Fa Chou, Kaohsiung (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/557,443

(22) Filed: Apr. 25, 2000

(30) Foreign Application Priority Data

Aug. 20, 1999 (TW) ........................................ 88114302 A

(51) Int. Cl.[7] .............................................. G11C 29/00
(52) U.S. Cl. ........................................ 714/718; 365/201
(58) Field of Search ............................ 714/718; 365/201

(56) References Cited

U.S. PATENT DOCUMENTS

| | | | | |
|---|---|---|---|---|
| 5,185,722 A | * | 2/1993 | Ota et al. ............... | 365/189.04 |
| 5,202,888 A | * | 4/1993 | Ochiai ........................ | 714/703 |
| 5,224,107 A | * | 6/1993 | Mattes ........................ | 714/718 |
| 5,345,423 A | * | 9/1994 | Koh et al. .................. | 365/201 |
| 5,400,342 A | * | 3/1995 | Matsumura et al. ........ | 365/200 |
| 5,436,910 A | * | 7/1995 | Takeshima et al. ......... | 365/201 |
| 5,691,942 A | * | 11/1997 | Inoue ..................... | 365/189.05 |
| 6,421,797 B1 | * | 7/2002 | Kim ............................ | 714/718 |

* cited by examiner

Primary Examiner—Albert Decady
Assistant Examiner—Anthony Whittington

(57) ABSTRACT

A comparable circuit employed for parallel testing DRAM devices is disclosed, wherein the disclosed comparable circuit basically encompasses a three-stage circuit composed of two XNOR gates, a XOR gate, and a tri-state output buffer. The first stage consisting of the XOR gate and a first XNOR gate parallel receive the stored test pattern from the detected memory cell to respectively generate a pair of first comparison results. A second exclusive XNOR gate included in the second stage receives the first comparison results, and connects with the third stage through an output terminal of the second XNOR gate. The third stage composed of the output buffer couples with the output terminal of the second XNOR gate to generate a second comparison result further routed to I/O bus. Chess-like test patterns can be employed in the disclosed comparable circuit due to two mutually exclusive logic gates are generated in the first stage. On the other hand, logic 1 freezes on I/O bus if two input terminals of the second XNOR gate are shorted, which indicates the comparable circuit is defective.

14 Claims, 4 Drawing Sheets

COMPARABLE CIRCUITS FOR PARALLEL TESTING DRAM DEVICE

BACKGROUND OF THE INVENTION

1. Field of the Invention

The present invention relates to a comparable circuit for testing DRAM devices, and more particularly, to a comparable circuit for parallel testing the DRAM devices with self-diagnostic mechanism.

2. Description of the Prior Art

The approaches of the memory devices bring the modern electrical devices broadly employed in human' lives because the kernels of the electrical devices, which are usually the microprocessors and microcomputers, store or retrieve their currently used data from memories on-chip therein. Those commonly used memory devices, especially DRAM (dynamic random access memory) devices, are broadly used memories due to their cost and operation speeds. In the present days, a high density DRAM device having $2^{20}$ bits or more has been developed in an integrated circuit. A testing procedure is thus unavoidable especially when the DRAM devices are mass-produced.

Nowadays, parallel testing becomes a common used approach for testing whether a DRAM device is fault because many DRAM devices can be detected simultaneously. Please refer to FIG. 1, which depicts a 4M×4 DRAM device 100 composed of four 1M×4 memory cells 100A, 100B, 100C, and 100D to be parallel detected in U.S. Pat. No. 4,860,259 disclosed by Tobita. I/O bus having four testing signals $IO_0$, $IO_1$, $IO_2$, $IO_3$, are routed into the detected cells 100A to 100D simultaneously but accompanied with a control signal $S_{test}$ for indicating the testing period. For example, $S_{test}$ can be pulled to high (logic 1) under a WCBR (Write CAS (Column Address Strobe) Before RAS (Row Address Strobe)) specification and accompanied with a test pattern loaded on $IO_0$, $IO_1$, $IO_2$, and $IO_3$. Four I/O blocks (IOBLK) 102A, 102B, 102C, and 102D latch the loaded test pattern and direct it to cells 100A, 100B, 100C, and 100D for storing when selection signals SECA, SECB, SECC, and SECD are enabled, respectively. Next, the stored test pattern is read from cells 100A, 100B, 100C, and 100D and then routed to a associated comparable circuit for detecting whether the test pattern is written correctly. Each one of the comparable circuits 104A, 104B, 104C, and 104D consists of two exclusive OR (XOR) gates 106 and 108, an OR gate 110 and a tri-state output buffer 112 to generate a one bit output by using the test pattern. The one bit output is then respectively routed on $IO_0$, $IO_1$, $IO_2$, and $IO_3$ according to their sections. Accordingly, by detecting the logic states from $IO_0$, $IO_1$, $IO_2$, and $IO_3$ can decide whether the detected memory cell is defective or not. For example, if a test pattern {0000} that is stored in then read out from the memory cell 100A, both outputs of the XOR gates are logic 0 because all their input terminals receive logic 0 as inputs. Obviously, the outputs of both the OR gate 110 and output buffer 112 are logic 0, which indicates the detected memory cell is perfect. In contrast, if logic 1 appears on the output buffer, the detected memory cell can be concluded as defective because an error evidently occurs when retrieving the stored test pattern. As noted, logic 1 and logic 0 appear on I/O bus indicate an error or a normal condition is obtained in the testing procedure according to WCBR specification. One disadvantage of the Tobita reference is that only four test patterns {0000}, {0011}, {1100} and {1111} can be used in the comparable circuit. Any test pattern having different logic states at two input terminals of the XOR gates 106 or 108 will cause the output buffer 112 to output logic 1, the detected memory cell is thus treated as defective even it is perfect. Additional test procedures are thus unavoidable for testing DRAM devices.

Another conventional approach, such as the circuits disclosed by McClure et al in U.S. Pat. No. 5,265,100 is also shown in FIG. 2 for testing the DRAM devices. In McClure reference, four comparable circuits 204A, 204B, 204C and 204D are provided for detecting the retrieved test patterns from the memory cells 100A, 100B, 100C and 100D, respectively. Each one of the comparable circuits 204A, 204B, 204C and 204D is composed of two exclusive NOR (XNOR) gates 206 and 208, a NADN gate 210, and a tri-state output buffer 212. Operations of the McClure reference are similar to Tobita reference except the comparable circuits are. For example, a testing pattern is also loaded on $IO_0$, $IO_1$, $IO_2$, and $IO_3$, and directed into the detected devices 100A to 100D simultaneously, a control signal $S_{test}$ is also accompanied with to indicate the testing period. Four one bit outputs of the output buffers 212 are also respectively routed on $IO_0$, $IO_1$, $IO_2$, and $IO_3$ according to their sections. However, only four test patterns as the Tobita reference's can be used in McClure reference because any test pattern having different logic states at two input terminals of the XNOR gates 206 or 208 will cause the output buffer 212 to be logic 1. Additional test procedures are also unavoidable because the detected memory cell will also be treated as defective even it is perfect. On the other hand, another fatal disadvantage of the above two references is that it is impossible to distinguish whether a detected memory cell is defective when the comparable circuit is imperfect. Please refer to FIG. 4A, which depicts a short circuit 214 occurs between two input terminals (nodes E and F) of the NAND gate 210. Obviously, nodes E and F always keep the same logic state due to the short circuit 214 whatever the logic states of nodes A, B, C, and D are. Therefore, the logic state of node G (also the input terminal of the output buffer 212) can not correctly indicate the currently detecting situation. A need has arisen to disclose a comparable circuit, in which the disadvantages of the conventional schemes, such as fewer test patterns can be employed and it is impossible to distinguish whether the comparable circuit or the detected memory cell is defective, can be completely overcome.

SUMMARY OF THE INVENTION

The principal object of the invention is to provide a comparable circuit for parallel detecting DRAM devices with more test patterns.

The other object of the invention is to provide a comparable circuit with self-diagnostic mechanism.

According to the aforementioned objects, the disclosed comparable circuit basically includes a three-stage circuit composed of two XNOR gates, a XOR gate, and a tri-state output buffer. The first stage consisting of the XOR gate and a first XNOR gate parallel receive the stored test pattern from the detected memory cell to respectively generate the first comparison results. A second exclusive XNOR gate included in the second stage receives the comparison results from the first stage as inputs, and connects with the third stage through an output terminal of the second XNOR gate. The third stage composed of the output buffer couples with the output terminal of the second XNOR gate to generate the second comparison result routed on I/O bus. Chess-like test patterns can be employed in the disclosed comparable circuit due to two mutually exclusive logic gates are applied in the first stage. On the other hand, logic 1 freezes on I/O bus if two input terminals of the second XNOR gate are shorted, which indicates the comparable circuit is defective.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
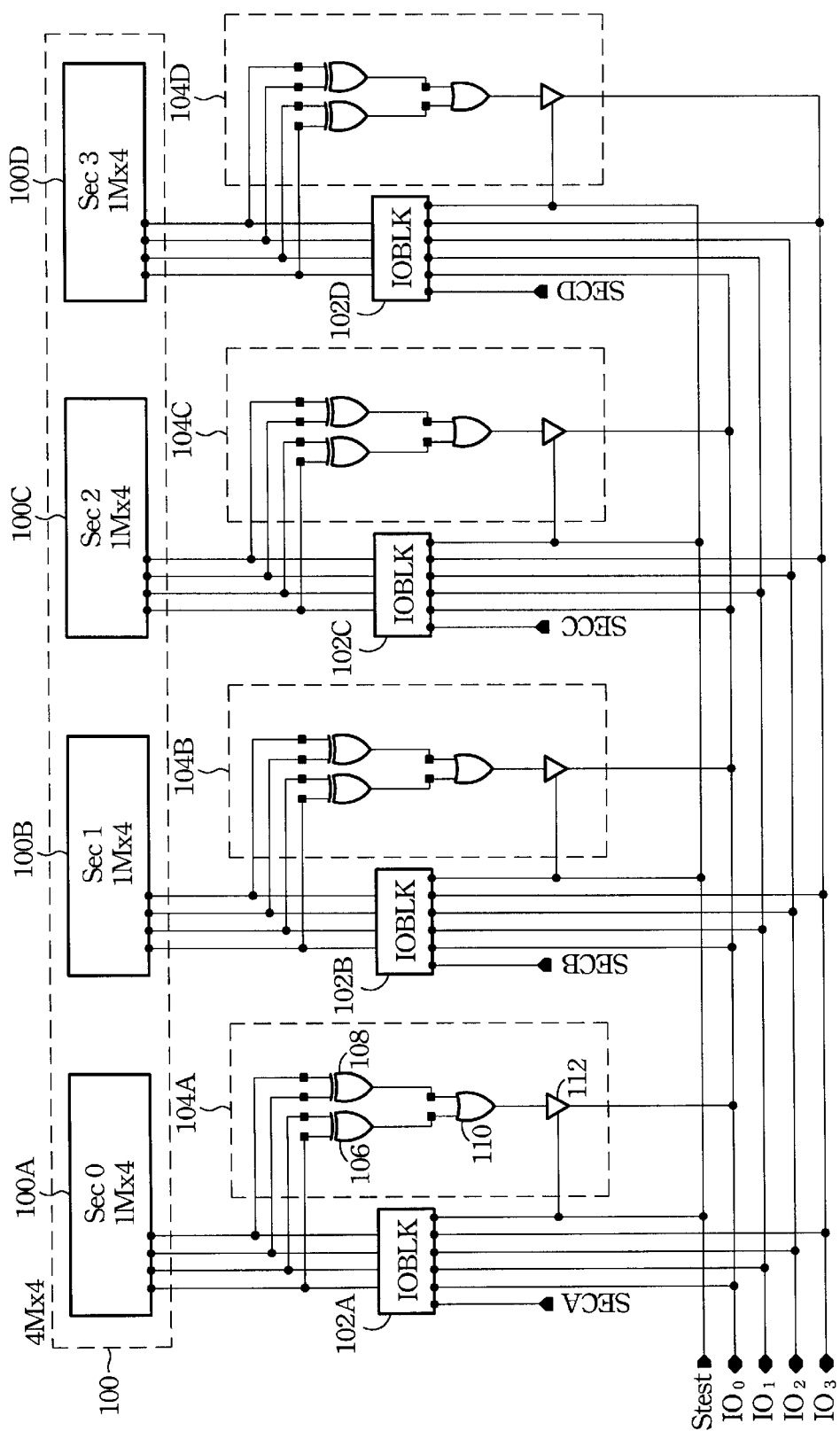
FIG. 1 depicts a 4M×4 DRAM device composed of four 1M×4 memory cells to be parallel detected in Tobita reference.
Figure 2:
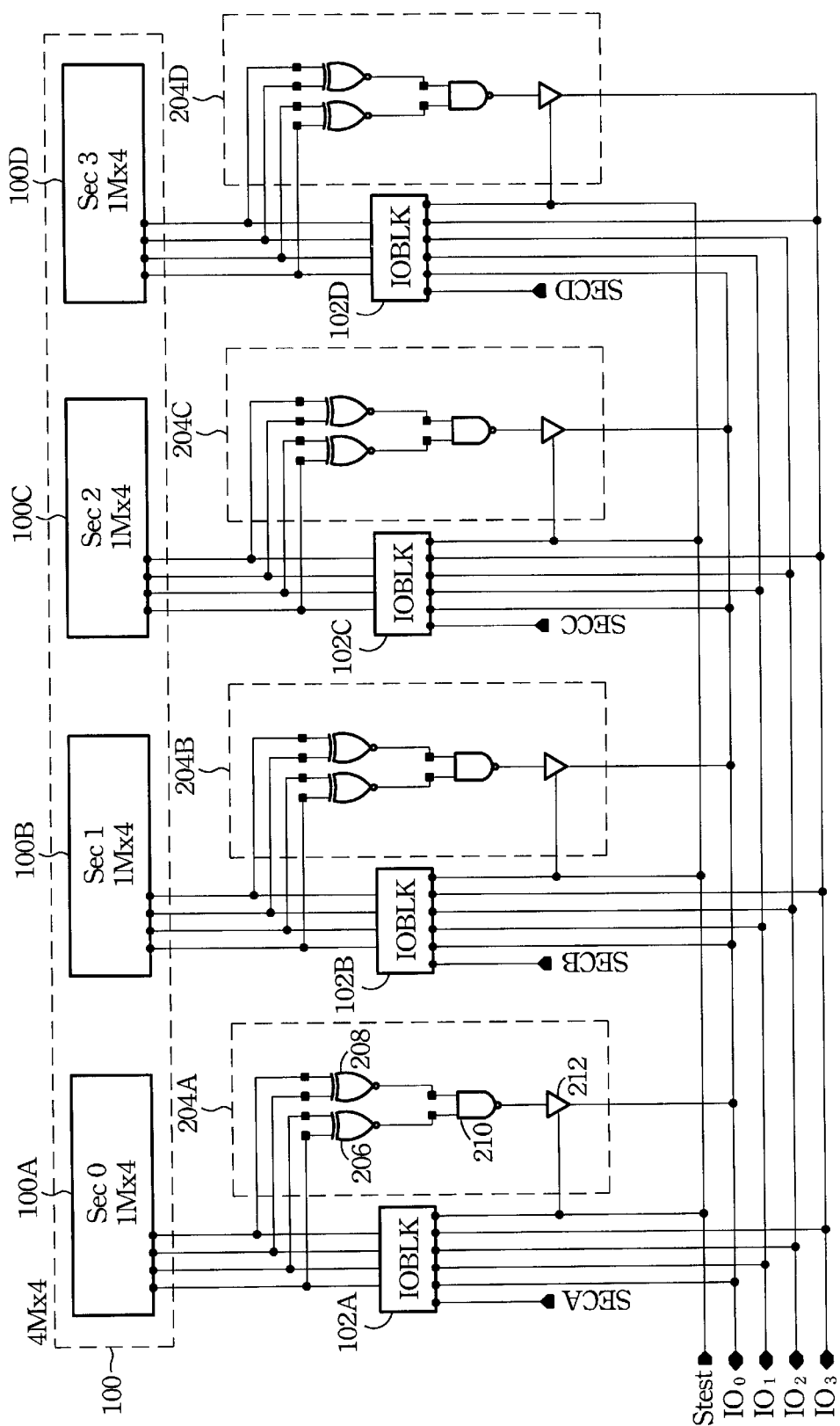
FIG. 2 depicts a 4M×4 DRAM device composed of four 1M×4 memory cells to be parallel detected in McClure reference.
Figure 3:
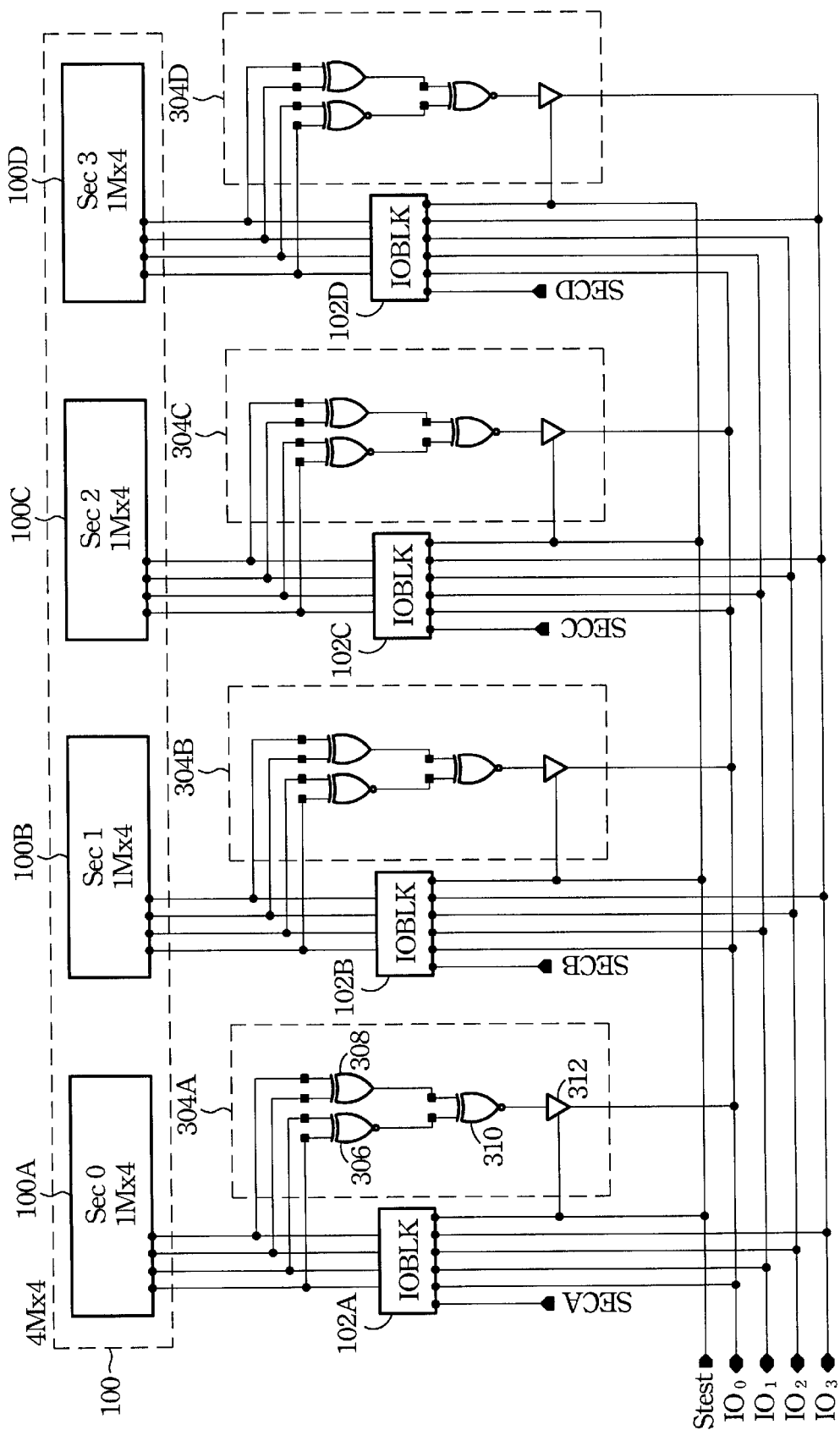
FIG. 3 depicts the comparable circuit disclosed in the present invention.

Please refer to FIG. 3, which demonstrates a schematic diagram illustrative of the circuit diagram of the invention, wherein four comparable circuits 304A, 304B, 304C, and 304D are shown therein. Each the comparable circuit is composed of two XNOR gates 306 and 310, a XOR gate 308, and a tri-state output buffer 312. Furthermore, each the comparable circuit can be divided into a three-stage circuit as descriptions given hereinafter. The first stage consisting of the XOR gate 308 and a first XNOR gate 306 parallel receive the stored test pattern from the detected memory cell to generate first comparison results. Please note that the first comparison results are a pair of outputs from output terminals of the XNOR gate 306 and NOR gate 308, and identical test results will be obtained even exchanging the positions between the XNOR gate 306 and the NOR gate 308 in first stage. A second XNOR gate 310 included in the second stage receives the first comparison results from the first stage and connects with the third stage through an output terminal of the second XNOR gate 310. As noted, the second comparison result generated by the second XNOR gate 310 are directed from an output terminal of the XNOR gate 310 to the third stage. The third stage composed of the output buffer 312 couples with output terminal of the second XNOR gate 310 to receive the second comparison result, wherein the second comparison result is directed to I/O bus according to the control signal $S_{test}$.

Test operations employed in the invention are the same as the aforementioned conventional approaches. For example, a testing pattern is also loaded on I/O bus (i.e., $IO_0, IO_1, IO_2,$ and $IO_3$) and directed into the detected devices 100A to 100D simultaneously, and further accompanied with a control signal $S_{test}$ for indicating the testing period by following WCBR specification. Four one bit outputs of the output buffers 312 are also respectively routed on I/O bus according to their sections. However, four more chess-like test patterns {0101}, {1010}, {1001}, and {0110} can be applied in the disclosed comparable circuit due to XOR and XNOR gates are employed. By using the test pattern {0101} as example, logic 0 and logic 1 respectively appear at output terminals of the first XNOR gate 306 and NOR gate 308. Accordingly, logic 0 will simultaneously appear on output terminals of both the second XNOR gate 310 and the output buffer 312. It is noted that the outputs of the first XNOR gate 306 and XOR gate 308 are mutually inverted phase to each other, and the detected logic 0 is directed on I/O only when the control signal $S_{test}$ is enabled. Of course, the other three chess-like test patterns significantly have the same test results as the test pattern {0101}. DRAM devices can thus be parallel tested by means of four more test patterns than before.

Figure 4B:
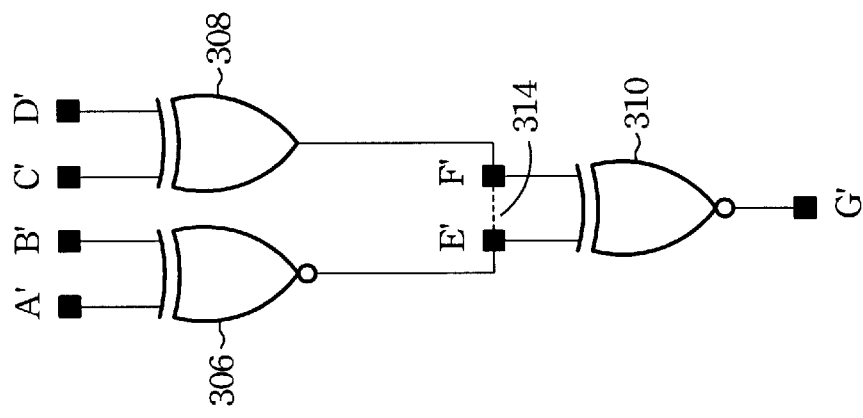
FIG. 4B depicts a short circuit occurs between two input terminals of the second stage in the invention.
Figure 4A:
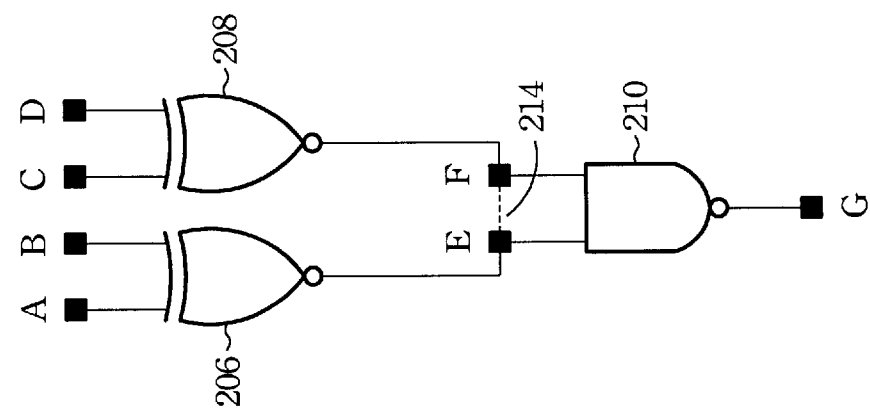
FIG. 4A depicts a short circuit occurs between two input terminals of the second stage in Tobita reference.

On the other hand, the disclosed comparable circuit will maintain (or fixed) at logic 1 at which the comparable circuit is defective. For example, please refer to FIG. 4B, which depicts a short circuit 314 occurs between nodes E' and F' (i.e., two input terminals of XNOR gate 310) of the second stage in the invention. Logic 1 freezes on node G' evidently when a short circuit occurs between two input terminals of the second XNOR gate 310 no matter what the voltage levels of the nodes A', B', C' and D' are. The operators can immediately know which one of the comparable circuits is imperfect by conclusion from testing some memory cells.

Elementary advantages offered by the disclosed comparable circuit are described following. Firstly, four more chess-like test patterns can be normally employed for testing DRAM devices, which indicates that more defective DRAM devices can be detected and then removed when a parallel testing procedure is performed. Secondly, a self-diagnostic mechanism is included therein for indicating a short circuit occurs inside the comparable circuit. The operators can replace another perfect comparable circuit for continuing consequent test procedures instead of testing the DRAM devices without consciousness.

As is understood by a person skilled in the art, the foregoing preferred embodiments of the present invention are illustrated of the present invention rather than limiting of the present invention. It is intended to cover various modifications and similar arrangements included within the spirit and scope of the appended claims, such as exchanging the positions of the XNOR and XOR gates, the scope of which should be accorded the broadest interpretation so as to encompass all such modifications and similar structure.

What is claimed is:

1. A comparable circuit for detecting dynamic random access memory (DRAM) devices, wherein said comparable circuit comprises:

first detecting means responsive to a stored test pattern from said DRAM devices for generating a pair of first comparison results, wherein one of said first comparison results is substantially an inverted phase of another one of said first comparison results when the DRAM devices are perfect and one of said first comparison results is substantially a same phase of another one of said first comparison results when the DRAM devices are defective;

second detecting means responsive to said first comparison results for generating a second comparison result, wherein the second comparison result is logic 0 when the DRAM devices and the comparable circuit are perfect and the second comparison result is logic 1 when the DRAM devices or the comparable circuit are defective; and an output buffer responsive to a test control signal for outputting said second comparison result.

2. The comparable circuit according to claim 1, wherein said first detecting means comprises:

a first exclusive nor (XNOR) gate having at least two input terminals and at least one output terminal, said input terminals of said first XNOR gate being responsive to portions of said stored test pattern to generate one of said first comparison results, one of said first comparison results being output from said output terminal of said first XNOR gate; and an exclusive or (XOR) gate having at least two input terminals and at least one output terminal, said input terminals of said XOR gate being responsive to another portions of said stored test pattern to generate and output another one of said first comparison results, another one of said first comparison results being output from said output terminal of said XOR gate.

3. The comparable circuit according to claim 2, wherein said second detecting means comprises a second XNOR gate having at least two input terminals and at least one output terminal, said input terminals of said second XNOR gate being responsive to said pair of said first comparison results to generate said second comparison result, said second comparison results being output from said output terminal of said second XNOR gate.

4. The comparable circuit according to claim 3, wherein said comparable circuit is concluded as defective when at least two of said input terminals of said second XNOR gate being coupled together.

5. The comparable circuit according to claim 1, wherein said output buffer comprises a tri-state output buffer having two input terminals and an output terminal, wherein said test control signal is directed to one of said input terminals for outputting said second comparison result from said output terminal of said tri-state output buffer.

6. The comparable circuit according to claim 1, wherein said test pattern is selecting from the groups of:
{0000};
{0011};
{1100};
{0101};
{1010};
{1001}; and
{0110}.

7. A circuit for testing dynamic random access memory (DRAM) devices, wherein said testing circuit comprises:
a plurality of memory cells for storing a test pattern;
latching means responsive to a section control signal for transferring said test pattern to said memory cells; and
testing means responsive to a test control signal for testing whether said memory cells to be defective, wherein said testing means comprises:
first detecting means responsive to said test pattern stored in said DRAM devices for generating a pair of first comparison results, wherein one of said first comparison results is substantially an inverted phase of another one of said first comparison results when the DRAM devices are perfect and one of said first comparison results is substantially a same phase of another one of said first comparison results when the DRAM devices are defective;
second detecting means responsive to said first comparison results for generating a second comparison result, wherein the second comparison result is logic 0 when the DRAM devices and the comparable circuit are perfect and the second comparison result is logic 1 when the DRAM devices or the comparable circuit are defective; and
an output buffer responsive to said test control signal for outputting said second comparison result.

8. The testing circuit according to claim 7, wherein said first detecting means comprises:
a first exclusive nor (XNOR) gate having at least two input terminals and at least one output terminal, said input terminals of said first XNOR gate being responsive to portions of said stored test pattern to generate one of said first comparison results, one of said first comparison results being output from said output terminal of said first XNOR gate; and
an exclusive or (XOR) gate having at least two input terminals and at least one output terminal, said input terminals of said XOR gate being responsive to another portions of said stored test pattern to generate and output another one of said first comparison results, another one of said first comparison results being output from said output terminal of said XOR gate.

9. The testing circuit according to claim 8, wherein said second detecting means comprises a second XNOR gate having at least two input terminals and at least one output terminal, said input terminals of said second XNOR gate being responsive to said pair of said first comparison results to generate said second comparison result, said second comparison results being output from said output terminal of said second XNOR gate.

10. The testing circuit according to claim 9, wherein said comparable circuit is concluded as defective when at least two of said input terminals of said second XNOR gate being coupled together.

11. The testing circuit according to claim 7, wherein said output buffer comprises a tri-state output buffer having two input terminals and an output terminal, wherein said test control signal is directed to one of said input terminals for outputting said second comparison result from said output terminal of said tri-state output buffer.

12. The comparable circuit according to claim 7, wherein said test pattern is selecting from the groups of:
{0000};
{0011};
{1100};
{1111};
{0101};
{1010};
{1001}; and
{0110}.

13. A method for testing a dynamic random access memory (DRAM) devices, wherein said testing method comprises the steps of:
storing a test pattern in memory cells of said DRAM devices;
retrieving said stored test pattern;
generating a pair of first comparison results by using said test pattern, wherein one of said first comparison results is substantially an inverted phase of another one of said first comparison results when the DRAM devices are perfect and one of said first comparison results is substantially a same phase of another one of said first comparison results when the DRAM devices are defective;
generating a second comparison result by using said first comparison results, wherein the second comparison result is logic 0 when the DRAM devices and the comparable circuit are perfect and the second comparison result is logic 1 when the DRAM devices or the comparable circuit are defective; and
outputting said second comparison result by using a test control signal.

14. The method according to claim 13, wherein said test pattern is selecting from the groups of:

{0000};
{0011};
{1100};
{1111};
{0101};
{1010};
{1001}; and
{0110}.

* * * * *